United States Patent
Li et al.

(10) Patent No.: US 6,380,684 B1
(45) Date of Patent: Apr. 30, 2002

(54) PLASMA GENERATING APPARATUS AND SEMICONDUCTOR MANUFACTURING METHOD

(75) Inventors: Yunlong Li; Masanobu Sato; Yoshio Tominaga, all of Tokyo; Noriyoshi Sato; Satoru Iizuka, both of Sendai, all of (JP)

(73) Assignee: Hitachi Kokusai Electric Inc., Tokyo ( * ) Notice: Subject to any disclaimer, the term of this patent is extended or adjusted under 35 U.S.C. 154(b) by 0 days.

(21) Appl. No.: 09/573,253

(22) Filed: May 18, 2000

(30) Foreign Application Priority Data

May 18, 1999 (JP) ............................................ 11-136817
May 10, 2000 (JP) ............................................ 12-136863

(51) Int. Cl.[7] .............................................. H05H 1/46
(52) U.S. Cl. ............................. 315/111.21; 118/723 E; 156/345; 204/298.37
(58) Field of Search ................ 315/111.21, 111.81; 156/345; 118/723 R, 723 E; 204/298.37, 192.15, 192.25; 427/553

(56) References Cited

U.S. PATENT DOCUMENTS 5,272,417 A * 12/1993 Ohmi ..................... 315/111.21
5,698,062 A * 12/1997 Sakamoto et al. ........... 156/345
6,020,570 A * 2/2000 Taki et al. ............. 219/121.43

FOREIGN PATENT DOCUMENTS

JP 7-201831 8/1995

OTHER PUBLICATIONS

U.S. application No. 09/123,352, Li et al., filed Jul. 28, 1998.
U.S. application No. 09/234,488, Li et al., filed Jan. 21, 1999.

* cited by examiner

*Primary Examiner*—Don Wong
*Assistant Examiner*—Thuy Vinh Tran
(74) *Attorney, Agent, or Firm*—Oliff & Berridge, PLC

(57) ABSTRACT

A plasma generating apparatus and processing method, which generate high-density plasma, even in the central portion of the plasma generating zone. The apparatus comprises rectangular electrodes, a rectangular fistulous discharge electrode which surrounds the plasma generating zone, and a vacuum chamber of rectangular cross-section. Permanent magnets surround the discharge electrode, produce predetermined magnetic lines of force with portions which extend approximately parallel to the central axis of discharge electrode. A pair of parallel plate electrodes define the extension of the plasma generating zone in the direction of the central axis of the discharge electrode. The apparatus is configured such that the magnetic lines of force passing through the central portion of the plasma generating zone do not intersect with the electrodes.

15 Claims, 10 Drawing Sheets

PLASMA GENERATING APPARATUS AND SEMICONDUCTOR MANUFACTURING METHOD

BACKGROUND OF THE INVENTION

1. Field of the Invention

The present invention relates to a modified magnetron high-frequency discharge plasma generating apparatus and to a semiconductor manufacturing method, and more particularly to an apparatus for performing various processes on rectangular substrates using a plasma, such as plasma dry etching of a film formed on the surface of a large-area rectangular substrate, or suitable as a plasma CVD (chemical vapor deposition) apparatus for producing a thin film on the surface of a substrate using a plasma-induced vapor phase reaction.

2. Description of the Related Art

In production processes for solid state devices such as semiconductor devices, it is necessary to subject substrates to predetermined processes. One such substrate processing method involves introducing a reactive gas into the reaction chamber in which the process will be performed, and applying heat to induce the gas to react so as to deposit a film on the substrate surface. This method requires relatively high temperatures, which may have a number of adverse effects on devices. Thus, more recently, plasma CVD techniques in which the energy needed to activate the reaction is supplied by a plasma generated through a glow discharge have come into use.

Plasma CVD techniques are also employed for film deposition on rectangular substrates for use in liquid crystal displays of various types, solar cells, and the like. In plasma CVD—the plasma process used for typical large-area rectangular substrates—uniform high-density plasma is needed to accommodate larger-area substrates and to improve apparatus through-put. Plasma sources to meet this need are currently under development. As used herein, "typical large-area rectangular substrates" refers to those of 860 mm×650 mm class or larger.

However, the plasma sources most relied upon currently are ordinary parallel plate high-frequency discharge plasma sources. Since ordinary parallel plate high-frequency discharge plasma sources generate plasma rather inefficiently, the low film deposition rate poses problems when depositing a film on a substrate surface using plasma CVD. Also, the uniformity of film thickness cannot be said to be adequate at present.

To accommodate rectangular substrates, ordinary parallel plate high-frequency discharge plasma sources currently in use are designed with rectangular electrodes, but since the electric field tends to become concentrated at the corners of the electrodes, plasma density tends to be higher at the electrode corners, with the rate of film deposition being higher in proximity to the electrode corners as well. Using an ordinary parallel plate high-frequency discharge plasma source, when it is attempted to increase the high-frequency power input in order to increase the throughput of the apparatus, high sheath voltage tends to form on the cathode electrode surface to which the high frequency is applied, resulting in a serious problem of metal contamination from the electrode surface. As used herein, "sheath voltage" refers to the potential of the substrate surface relative to the average potential of the plasma space.

Besides the parallel plate high-frequency discharge plasma sources, electron-cyclotron resonance (ECR) plasma sources, inductively-coupled plasma (ICP), micro surface wave, helicon wave, and other high-density plasma sources are also available, but while these give adequate plasma densities, they still have not reached plasma uniformity levels adequate for processing of large-area substrates.

On the other hand, a modified magnetron plasma source employing annular high-frequency electrodes has been disclosed (JP(A) 7-201831). The plasma generating apparatus disclosed in this publication generates plasma by producing a magnetron discharge from a high-frequency electrical field generated by a cylindrical discharge electrode and magnetic fields generated by annular permanent magnets.

The plasma generating apparatus disclosed in the above publication, however, has the drawback that high density plasma cannot be generated in the diametral central area of the plasma generation zone. This is due to the fact that plasma is generated predominantly on the surface of the discharge electrode. Accordingly, any plasma surface processing apparatus designed using this plasma generating apparatus will not be capable of surface processing under conditions of uniform plasma density. This problem can be solved by locating the susceptor some distance from the discharge electrode in the axial direction thereof.

This design, however, while affording surface processing under conditions of uniform plasma density, produces a new problem, namely, inability to perform surface processing under conditions of high plasma density, owing to the excessively large volume of the vacuum chamber. In a plasma generating apparatus of this kind, plasma density declines further away from the discharge electrode in the axial direction thereof due to plasma diffusion loss. Thus, with this design the rate of surface processing tends to be slow, and the efficiency of utilization of the gas and the efficiency of utilization of the electrodes tend to be poor.

Accordingly, there is a need for an apparatus capable of generating high density plasma in both the central area of the discharge electrode as well as in the peripheral area.

SUMMARY OF THE INVENTION

With the foregoing in view, it is an object of the present invention to provide a modified magnetron high-frequency discharge plasma generating apparatus and a semiconductor manufacturing method that solve the problems pertaining to the conventional art so as to allow plasma processing of large-area rectangular substrates to be conducted at high speed.

The plasma generating apparatus recited in claim 1 comprises: a vacuum chamber of rectangular cross section having a plasma generating zone provided therein; gas introducer for introducing a discharge gas into this vacuum chamber; an exhaust for exhausting the atmosphere within said vacuum chamber; a fistulous discharge electrode of rectangular shape (hereinbelow termed simply "rectangular fistulous"), arranged surrounding said plasma generating zone, for inducing discharge of the gas introduced into said plasma generating zone by said gas introducer; first high-frequency power supplier for supplying high-frequency power to said discharge electrode for inducing discharge of said gas; magnetic lines of force generator for producing magnetic lines of force within said plasma generating zone; and a pair of rectangular parallel plate electrodes, arranged so as to sandwich said plasma generating zone in the direction of the central axis of said discharge electrode and to define a range of said plasma generating zone in the direction of this central axis. "Rectangular fistulous" refers to a fistulous configuration having a rectangular aperture.

The gas introducer has the function of introducing the discharge gas and the reactive gas needed for plasma processing into the vacuum chamber. The exhaust has the function of exhausting the atmosphere present within the vacuum chamber to the outside, Since the vacuum chamber for processing the substrate is of rectangular configuration like the substrate, the vacuum chamber need not have excessively large volume in order to process a large-area rectangular substrate, thus improving the efficiency of utilization of the gas and the efficiency of utilization of the high-frequency discharge electrode. Since the discharge electrode for generating the plasma is also rectangular, the space in which the plasma is generated has the same rectangular shape as the substrate. Accordingly, the installation area required for the vacuum chamber can be reduced further, as a result reducing the area occupied thereby in the clean room in which it is installed and reducing the costs associated with clean room maintenance. Interaction between the high-frequency electrical field generated by supplying high-frequency power to the discharge electrode and the magnetic field created by the magnetic lines of force produced by the magnetic lines of force generator affords efficient gas discharge so that a high-density plasma may be formed within the plasma generating zone. With this arrangement, the efficiency of plasma generation may be improved by, for example, 10 times or more relative to ordinary capacitively coupled parallel plate systems.

According to the plasma generating apparatus recited in claim 2, the magnetic lines of force generator produces magnetic lines of force comprising portions that extend approximately parallel to the central axis of said fistulous discharge electrode of rectangular shape, these parallel portions increasing in length closer to said central axis. By producing magnetic field components that extend parallel to the rectangular fistulous discharge electrode surface, a magnetron discharge is created at the electrode surface through interaction of the electrical field and the magnetic field when high-frequency power is applied to the electrode, whereby a plasma may be generated efficiently even at low gas pressure. Additionally, by producing magnetic field components that extend parallel to the rectangular fistulous discharge electrode surface, electrons—which have low mass—are trapped in the magnetic field and thus do not readily impinge on the electrode surface, whereas heavier-mass ions are allowed to impinge on the electrode surface unaffected by the magnetic field, so that fewer charges build up on the electrode surface, sheath voltage on the electrode surface is minimal, and metal contamination from the electrode surface is reduced.

According to the plasma generating apparatus recited in claim 3 or 4, said magnetic lines of force generator comprises permanent magnets arranged coaxially with said rectangular fistulous discharge electrode so as to surround said discharge electrode, said two permanent magnets being arranged along the central axis, having polarities radially magnetized in opposite directions to each other. The use of permanent magnets of rectangular configuration (hereinbelow termed simply "rectangular permanent magnets") to generate a magnetic field affords ample magnetic field strength in proximity to the rectangular fistulous discharge electrode surface, whereas distance-wise the magnetic field strength attenuates sharply a predetermined distance, for example about 2 cm, away from the electrode surface, so that the effects thereof on the substrate can essentially be ignored. By manipulating the distance of the two permanent magnets it is possible to control magnetic field strength at the rectangular fistulous discharge electrode surface.

According to the plasma generating apparatus recited in claim 5 or 6, the magnetic lines of force on the rectangular fistulous discharge electrode surface are such that the flux density of the component coextensive with the central axis of the discharge electrode is lower proceeding from the center of said discharge electrode surface towards the ends of the central axis, and the directional component orthogonal to a central axis is higher proceeding from the center of said discharge electrode surface towards the ends of the central axis. Such a magnetic field distribution is readily achieved using the plasma generating apparatus recited in claim 3. By generating the aforementioned magnetic field distribution using two permanent magnets, it becomes possible to trap high-energy electrons on the rectangular fistulous discharge electrode surface, so that the energy of the electrons can be utilized efficiently to ionize neutral gas molecules.

In the above mentioned plasma generating apparatus, it is preferable to comprises second high-frequency power supplier for supplying high-frequency power to one of a pair of rectangular parallel plate electrodes, whereby the high-energy electrons trapped by the magnetic lines of force produced by the magnetic lines of force generator are caused to move in reciprocating fashion in a direction approximately parallel to the central axis of said rectangular fistulous discharge electrode; and controller for controlling the ratio of high-frequency powers supplied by the first and second high-frequency power suppliers to the discharge electrode and to one of said rectangular parallel plate electrodes, respectively.

Through interaction of the magnetic lines of force recited in claim 5 or 6 and the high-frequency electrical field applied across the parallel plate electrodes by the second high-frequency power supplier, plasma may be generated efficiently in the central zone in the vacuum chamber. This is because the magnetic lines of force extending perpendicular to the parallel plate electrodes are longer in the central portion and shorter in the outlying portions. The plasma generated by the high-frequency power applied to the rectangular fistulous discharge electrode by the first high-frequency power supplier is generated mainly in proximity to the rectangular fistulous discharge electrode. For this reason, plasma density distribution can be controlled through control of the ratio of the energy supplied by the first and second high-frequency power supplier.

In the plasma generating apparatus, it is preferable to comprises a system for controlling the phase of the high-frequency power supplied by the first and second high-frequency power supplier. By controlling the phase of the first and second high-frequency power, the space potential of the plasma can be controlled so as control the energy of the charged particles flowing into the substrate. Controlling plasma space potential also makes is possible to reduce plasma damage to the electrode surfaces.

Further, in the plasma generating apparatus, it is preferable that the other of the pair of rectangular parallel plate electrodes is connected to a base potential.

Here, the second high-frequency power may be applied to the top parallel plate electrode, i.e., the one opposite the substrate holder (susceptor), with the bottom parallel plate electrode (on which the substrate rests) being electrically grounded. Since the second high-frequency power is applied not to the electrode on which the substrate rests but rather to the opposite electrode, charge buildup on the substrate surface is negligible. The energy of the charged particles flowing into the substrate is quite low. This invention is effective as a process that does not require sheath voltage on the substrate surface. Alternatively, the second high-frequency power can be applied to the bottom parallel plate electrode, i.e., the susceptor, with the top parallel plate electrode being electrically grounded. By applying the second high-frequency power to the susceptor it is possible to produce a high sheath voltage on the substrate surface and to accelerate the charged particles flowing into the substrate.

Further, in the plasma generating apparatus, the other of the pair of parallel plate electrodes may be electrically floated.

Here, the second high-frequency power may be applied to the bottom parallel plate electrode, i.e., the susceptor, with the top parallel plate electrode being electrically floated. With the top parallel plate electrode electrically floated, not only is the sheath voltage forming on the top parallel plate electrode surface lower than with the apparatus of claim 7, but the plasma space potential is also lower, thus reducing plasma damage to the top parallel plate electrode and the reaction chamber wall. Alternatively, the second high-frequency power may be applied to the top parallel plate electrode, i.e., that opposite the susceptor, with the bottom parallel plate electrode being electrically floated. With the susceptor electrically floated, the energy of the charged particles flowing into the substrate can be better controlled than with the apparatus which the other of the pair of rectangular parallel plate electrodes is connected to the base potential. Also, electrically floating the susceptor results in low space potential in the plasma, thus minimizing plasma damage to the electrode surfaces and reaction chamber wall.

Further, in the plasma generating apparatus, it is preferable that the other of the pair of rectangular parallel plate electrodes is used as a holder for holding the substrate when a predetermined processes is performed on the substrate using a plasma. Where the plasma generating apparatus is used for plasma surface treatments, this other parallel plate electrode can be used as a holder for holding the substrate, thus simplifying the design.

Further, in the plasma generating apparatus, it is preferable that the rectangular fistulous discharge electrode constitutes a portion of the wall of said vacuum chamber, with a dielectric material (e.g., ceramic, quartz glass, etc.) being interposed at the joint between the vacuum chamber and the discharge electrode. The dielectric material interposed in the joint serves to maintain the vacuum seal. The resulting reaction chamber has a simple internal construction and is effective against particles. By adopting the design of the invention, it is furthermore possible to situate the permanent magnets in proximity to the inside surface of the rectangular fistulous discharge electrode so that an effective magnetic field may be formed on the discharge electrode surface. Additionally, since the exterior of the rectangular fistulous discharge electrode to which high-frequency power is applied is in contact with the air, temperature control of the discharge electrode is a simple matter.

According to the plasma generating apparatus recited in claim 7 or 8, the rectangular fistulous discharge electrode is situated within the vacuum chamber, with the gap between the rectangular fistulous discharge electrode and the inside wall of said vacuum chamber being less than half of the mean free path of electrons in the plasma under the gas pressure that will be employed in the process. This design simplifies the construction of the vacuum chamber. The purpose of making the gap in between the rectangular discharge electrode and the vacuum chamber smaller than half of the mean free path of electrons in the plasma is to prevent discharge from occurring within the gap.

According to the plasma generating apparatus recited in claim 9 or 10, the rectangular fistulous discharge electrode is situated within the vacuum chamber, with a dielectric material (e.g., high purity aluminum nitride, quartz glass, ceramic, etc.) being interposed in the gap between the rectangular fistulous discharge electrode and the inside wall of the vacuum chamber. The length of the dielectric material in the axial direction thereof is greater than the length of the rectangular fistulous discharge electrode in the axial direction thereof. This prevents discharge from becoming concentrated at the edges of the rectangular fistulous discharge electrode. By adopting the design of the invention, it is possible to fabricate the vacuum chamber in sections, thereby reducing production costs for vacuum chambers intended for use with large-area substrates.

In the plasma generating apparatus. It is preferable to comprises a gas shower plate for blowing out an even flow of a gas (a process gas, for example) onto the parallel plate electrode opposite the susceptor, in order to bring about more uniform processing of the surface of a rectangular substrate. The gas shower plate is of rectangular configuration like the substrate, and is provided with gas diffusion holes at equal intervals for producing uniform process gas coverage over the entire face of the substrate. To prevent abnormal discharge at the gas diffusion holes, jet hole diameter is 1 mm or smaller, and preferably 0.6 mm or smaller. By jetting the process gas by means of a gas shower plate arrangement it is possible to readily achieve uniform plasma processing of a substrate surface. Also, the need for positioning, as is required with process gas supplied via a nozzle arrangement, is obviated, giving the apparatus better operation and reproducibility.

According to the plasma generating apparatus recited in 11 or 12, at least two rectangular permanent magnets are symmetrically nested on one of the pair of rectangular parallel plate electrodes. By arranging the permanent magnets on one of the parallel plate electrodes (the top electrode, for example) provided with a gas shower plate, it becomes possible to create magnetron discharge at the plasma generating zone face of the top electrode through the interaction of magnetic field produced by the permanent magnets and the high-frequency electrical field applied to the electrode. This in turn makes it possible to generate a plasma efficiently at low pressure, allowing the process to be conducted efficiently. In preferred practice, the number of permanent magnets arranged on the top electrode will be an even number, in order to weaken magnetic field strength at the substrate surface. An odd number will produce a divergent magnetic field, as a result of which magnetic field strength will not be attenuated at the substrate surface. Where the magnetic field at the substrate surface is too strong to be ignored (20 gauss or above, for example), an uneven plasma distribution will be produced at the substrate surface, making uniform processing impossible. The magnetic field also causes charges to build up on the substrate surface, which may damage the substrate.

According to the plasma generating apparatus recited in claim 13 or 14, said rectangular fistulous discharge electrode is provided with curvature at the corners thereof. By providing the corners with curvature, it becomes possible to control the rate of plasma generation in the corners.

The semiconductor manufacturing method recited in claim 15 comprises the steps of: providing a vacuum chamber of rectangular cross section having a plasma generating zone provided therein, a fistulous discharge electrode of rectangular shape arranged surrounding said plasma generating zone, and a pair of rectangular parallel plate electrodes arranged so as to sandwich said plasma generating zone in the direction of the central axis of said discharge electrode and to define said plasma generating zone in the direction of this central axis: arranging a substrate within said plasma generating zone; producing a high-frequency electrical field in said plasma generating zone by supplying high-frequency power to said discharge electrode and said parallel plate electrodes; producing a magnetic field in said plasma generating zone; introducing a discharge gas into said plasma generating zone provided within said vacuum chamber while exhausting the atmosphere within said vacuum chamber; producing plasma by inducing discharge of the gas introduced into said plasma generating zone by means of interaction between said high-frequency electrical field and said magnetic field; and and subjecting said substrate to a predetermined plasma process using the plasma so generated.

According to this semiconductor manufacturing method, high-frequency power is supplied to the discharge electrode and the parallel plate electrodes to produce a high-frequency electrical field within the plasma generating zone, and a magnetic field is produced within the plasma generating zone. Discharge gas is introduced into the plasma generating zone while exhausting the atmosphere within the vacuum chamber. Interaction of the high-frequency electrical field and the magnetic field causes the gas introduced into the plasma generating zone to discharge and generate a plasma. The plasma so generated can be used for subjecting a substrate arranged within the plasma generating zone to a predetermined plasma process. Since the vacuum chamber, discharge electrode, and parallel plate electrodes are rectangular, the efficiency of utilization of the gas and the efficiency of utilization of the high-frequency power electrodes when processing a rectangular substrate is improved. Interaction between the high-frequency electrical field generated by supplying high-frequency power to the discharge electrode and the magnetic field created by the magnetic lines of force produced by the magnetic lines of force generator affords efficient gas discharge so that a high-density plasma may be formed within the plasma generating zone. With this arrangement, the efficiency of plasma generation may be improved by, for example, 10 times or more relative to ordinary capacitively coupled parallel plate systems. High quality plasma processing of the substrate is possible as a result. The semiconductor manufactured by the semiconductor manufacturing method is applicable to TFT etc. liquid crystal displays of various types.

In the above mentioned semiconductor manufacturing method, it is preferable that the substrate is subjected to a predetermined plasma process while controlling the ratio of high-frequency powers supplied to said discharge electrode and to said parallel plate electrodes. By manipulating the ratio of high-frequency power supplied to the discharge electrode and the parallel plate electrodes it is possible to control the density distribution of the plasma generated in the plasma generating zone. It is therefore possible to generate a plasma having a uniform density distribution throughout the entire plasma generating zone.

Further, in the above mentioned semiconductor manufacturing method, it is preferable that the substrate is subjected to a predetermined plasma process while setting the internal pressure of said vacuum chamber within the range of from 0.1 Pa to 40 Pa. According to the semiconductor manufacturing method of the present invention, it is possible to produce a magnetron discharge through interaction of an electrical field and a magnetic field, which can be used for efficient plasma generation even at low gas pressures. Thus, high quality plasma processing of substrates is possible even at low pressures of from 0.1 Pa to 40 Pa within the vacuum chamber.

DESCRIPTION OF THE EMBODIMENTS

The embodiments of the invention are described hereinbelow making reference to the accompanying drawings.

[1] Embodiment 1

[1-1] Design

Figure 1:
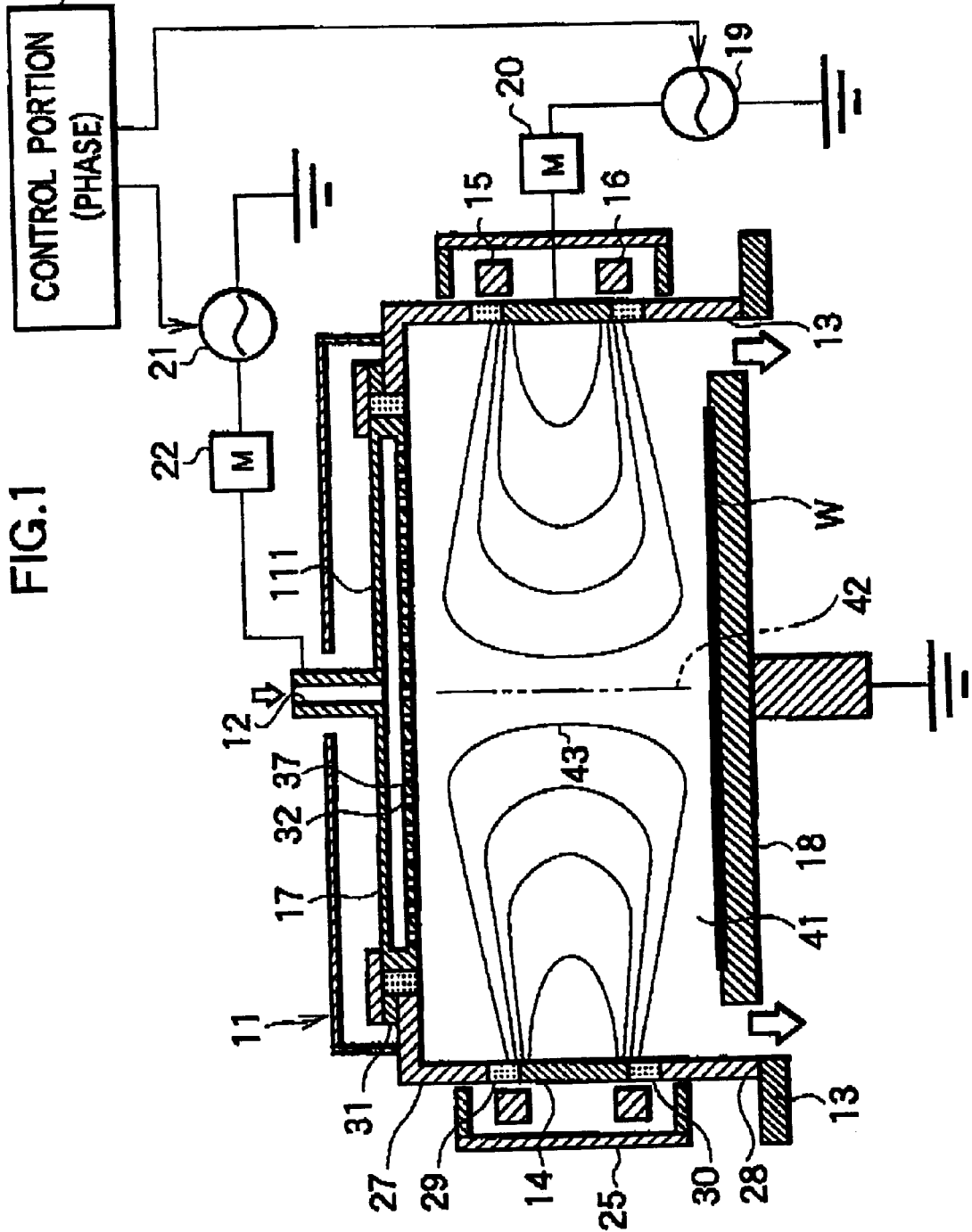
FIG. 1 is a side sectional view of the design of a first embodiment.

FIG. 1 is a side sectional view of the design of a first embodiment of the invention.

The plasma generating apparatus of the present embodiment comprises a vacuum chamber 11, a gas introduction portion 12, an exhaust portion 13, a discharge electrode 14, a pair of permanent magnets 15, 16, a pair of parallel plate electrodes 17, 18, a first high-frequency generator 19, a first matching circuit 20, a second high-frequency generator 21, a second matching circuit 22, a high-frequency shielding cover 25, and a control portion 26.

Vacuum chamber 11 is an airtight chamber provided therein with a plasma generating zone 41, and is of rectangular fistulous form such that when cut across the horizontal, the resulting aperture is rectangular, at least on the inside perimeter thereof. Here, the entire cross section, including the exterior perimeter, is rectangular. Vacuum chamber 11 is arranged in such a way that a center axis thereof is oriented vertically, for example. The gas introduction portion 12 is a portion for introducing a discharge gas into vacuum chamber 11, and has a circular fistular configuration, for example. This gas introduction portion 12 is provided to the top panel 11 of vacuum chamber 11 Exhaust portion 13 is a portion for exhausting the atmosphere within vacuum chamber 11, and has a circular fistular configuration, for example. This exhaust portion 13 is provided to the bottom electrode 18 of vacuum chamber 11.

Discharge electrode 14 is an electrode for generating a high-frequency electrical field for magnetron discharge, and has a rectangular fistulous configuration. Discharge electrode 14 is arranged coaxially with respect to vacuum chamber 11. Discharge electrode 14 is arranged in such a way as to surround is plasma generating zone 41. This discharge electrode 14 is incorporated in vacuum chamber 11 so as to form a part of the wall of vacuum chamber 11. That is, vacuum chamber 11 is divided horizontally into two sections, a top and a bottom section. Discharge electrode 14 is inserted between the top section 27 and the bottom section 28 thusly divided. Discharge electrode 14 and top section 27 are isolated from each other by a rectangular dielectric 29. Similarly, discharge electrode 14 and bottom section 28 are isolated from each other by a rectangular dielectric 30. Top section 27 and bottom section 28 are connected to a base potential. In the representative example shown in the drawing, this base potential is ground.

The pair of permanent magnets 15, 16 are magnets for generating magnetic lines of force for magnetron discharge. These permanent magnets 15, 16 are of rectangular band configuration. These permanent magnets 15, 16 are arranged in a vertical array coaxial with vacuum chamber 11. These permanent magnets 15, 16 are situated to the outside of discharge electrode 14 so as to encircle discharge electrode 14. The top permanent magnet 15 is positioned in proximity to the top edge of discharge electrode 14. The bottom permanent magnet 16, on the other hand, is positioned in proximity to the bottom edge of discharge electrode 14.

Permanent magnets 15, 16 are magnetized in the radial direction thereof. Here, permanent magnets 15, 16 are magnetized in mutually opposing directions. Let it be assumed, for example, that the inside portion of permanent magnet 15 is the N pole and the outside portion is the S pole. In this case the inside portion of permanent magnet 16 will be the S pole and the outside portion the N pole. In this way, within plasma generating zone 41 are produced looping magnetic lines of force 43 that extend from the inside portion of permanent magnet 15 towards the central axis 42 of discharge electrode 14, and then extend back towards the inside portion of permanent magnet 16. These magnetic lines of force 43 have portions substantially parallel to the central axis 42 of discharge electrode 14. The lengths of these parallel portions grow longer closer to central axis 42. Here, as a general rule interaction of the magnetic lines of force 43 emitted by each portion of permanent magnet 15 causes magnetic lines of force 43 to deflect back at points no further away therefrom than the central axis 42 of discharge electrode 14.

Figure 2:
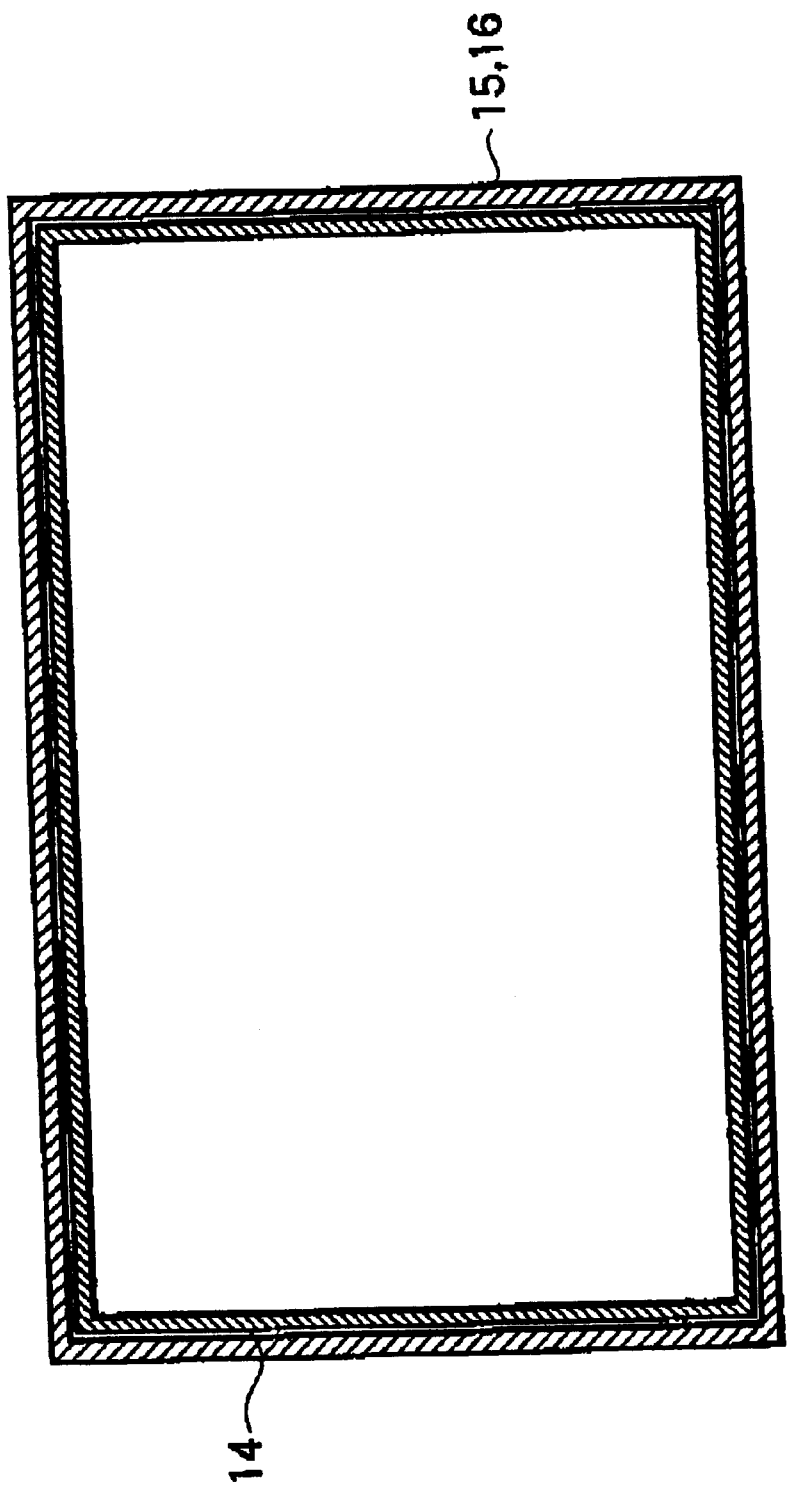
FIG. 2 is a plan view of morphologies for the rectangular fistulous discharge electrode and permanent magnet ring according to the first embodiment.
Figure 3:
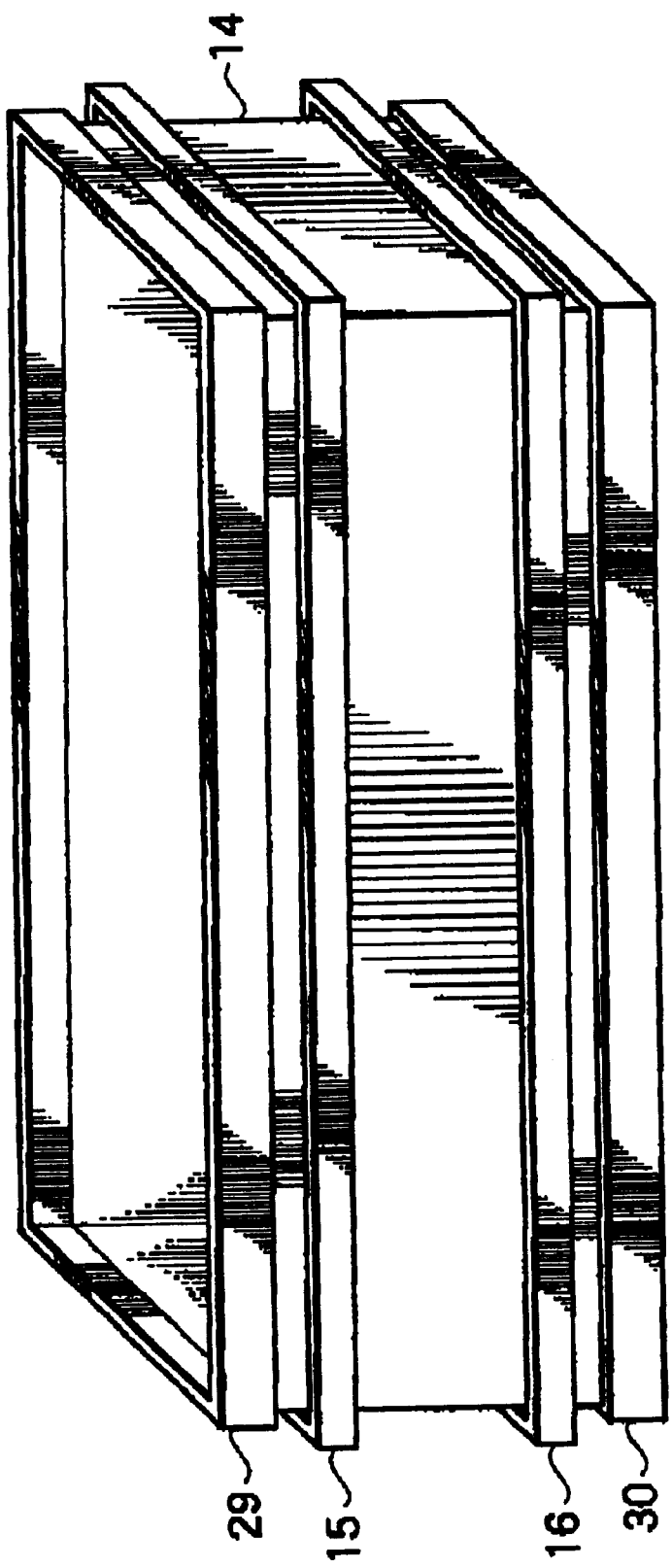
FIG. 3 is a perspective view showing morphologies and relative position for the rectangular fistulous discharge electrode and permanent magnet ring morphology according to the first embodiment.
Figure 4:
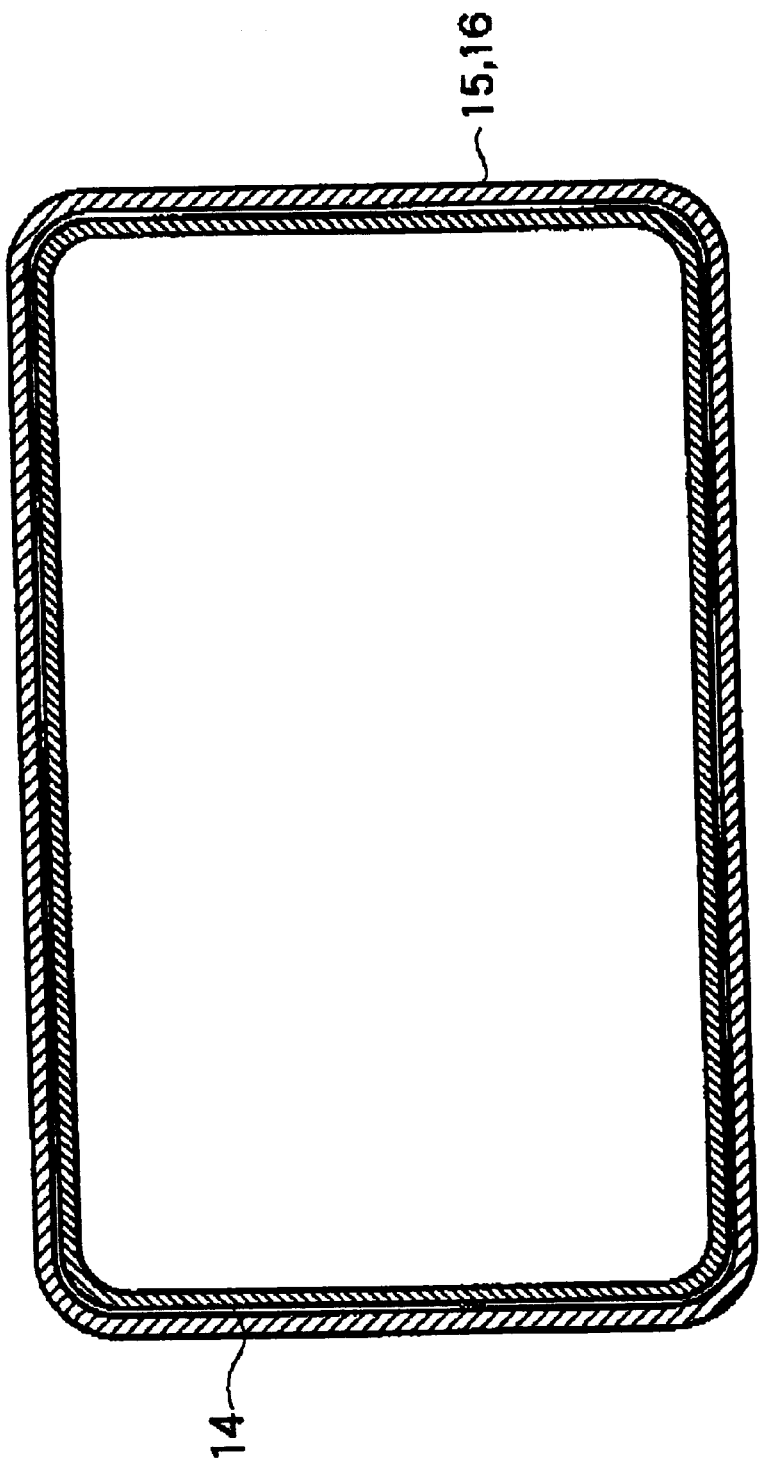
FIG. 4 is a plan view showing alternative morphologies for the rectangular fistulous discharge electrode and permanent magnet ring according to the first embodiment.

FIG. 2 is a plan view of the rectangular fistulous discharge electrode 14 and the rectangular band-shaped permanent magnets 15, 16 that make up the plasma generating apparatus described previously. FIG. 3 shows morphologies and relative position for rectangular fistulous discharge electrode 14, permanent magnets 15, 16, and dielectrics 29, 30. With this construction, vacuum chamber 11 can be fabricated in sections, reducing production costs for vacuum chambers 11 intended for use with large-area substrates. The corners of rectangular fistulous discharge electrode 14 may be provided with curvature R, as shown in FIG. 4. By providing the corners with curvature R, it becomes possible to control the rate of plasma generation in the corners to afford control of plasma density distribution.

The pair of parallel plate electrodes 17, 18 are of rectangular tabular configuration and serve as walls defining the extension of plasma generating zone 41 in the direction of the central axis 42 of charge electrode 14. These parallel plate electrodes 17, 18 are fabricated of a conductive materials Here, bottom electrode 18 is used, for example, as an electrode for generating a high-frequency electrical field for high-frequency oscillating discharge. These electrodes 17, 18 are arranged to either side of plasma generating zone 41 so as to sandwich the same in the direction of the central axis 42 of discharge electrode 14. These electrodes 17, 18 are arranged perpendicular to the central axis 42 of discharge electrode 14. The top electrode 17 and vacuum chamber 11 are insulated from each other by a dielectric 31, whereby top electrode 17 is electrically floated.

Top electrode 17 is used, for example, as gas diffusion plate for diffusing a discharge gas or process gas. For this purpose top electrode 17 is gas shower plate 37 of hollow construction provided on the bottom wall with a plurality of gas diffusion holes 32. Where the apparatus is to be used as a plasma surface treatment apparatus, bottom electrode 18 is used as a susceptor, for example. That is, it is used as a substrate holder on which a substrate W can rest.

First high-frequency oscillator 19 is an oscillator for outputting high-frequency power for magnetron discharge. This high-frequency oscillator 19 is connected to discharge electrode 14 via a first matching circuit 20, for example. Here, matching circuit 20 is a circuit for matching first high-frequency oscillator 19 and discharge electrode 14.

Second high-frequency oscillator 21 is an oscillator for outputting high-frequency power for high-frequency oscillating discharge. This high-frequency oscillator 21 is connected, for example, via a second matching circuit 22 to one or the other of the pair of parallel plate electrodes 17, 18, for example, the top electrode 17. Here, matching circuit 22 is a circuit for matching second high-frequency oscillator 21 and top electrode 17.

High-frequency shielding cover 25 is a cover for shielding the high-frequency electrical field generated outside vacuum chamber 11 by discharge electrode 14, and is attached to the outside wall of vacuum chamber 11 so as to cover discharge electrode 14.

Control portion 26 is a control portion for electrical control of the magnitude of high-frequency power output by high-frequency oscillators 19, 21 in response to control inputs from a human operator, for example. The ratio of the magnitudes of the two high-frequency power outputs is controlled to a predetermined value by control portion 26. This predetermined value can be value affording plasma of uniform density in the radial direction of discharge electrode 14, for example.

Control portion 26 may comprise a system for controlling the phase of the high frequencies output by high-frequency oscillators 19, 21. By controlling the phase of the high frequencies output by high-frequency oscillators 19, 21, the space potential of the plasma can be controlled and the energy of the charged particles flowing into substrate W can be controlled. By controlling the space potential of the plasma it is additionally possible to reduce plasma damage occurring on the electrode surface.

In the preceding design, gas introduction portion 12 corresponds to the gas introducer and exhaust portion 13 corresponds to the exhaust. Permanent magnets 15, 16 correspond to the magnetic lines of force generator. First high-frequency oscillator 19 and first matching circuit 20 correspond to the first high-frequency power applier of the invention; second high-frequency oscillator 20 and second matching circuit 22 correspond to the second high-frequency power applier; and control portion 26 corresponds to the control.

The plasma generating apparatus of the present embodiment is designed with a configuration such that the magnetic lines of force extending through the central portion of plasma generating zone 41 do not insect the pair of electrodes 17, 18. This is accomplished, for example, by appropriate setting of selected parameters. These parameters include, for example, the dimensions of vacuum chamber 11, the positions, dimensions, and spacing (namely, the gap therebetween in the direction of central axis 42 of discharge electrode 14) of permanent magnets 15, 16, the positions and spacing (namely, the gap therebetween in the direction of central axis 42 of discharge electrode 14) of parallel plate electrodes 17, 18, and so on. This non-intersecting design can be accomplished, for example, by appropriate setting of one or more of these parameters.

[1-2] Operation

The discussion now turns to the plasma generating operation and method for plasma processing of a substrate using the design described above.

(1) Plasma Generation Through Magnetron Discharge

The operation of plasma generation through magnetron discharge is discussed first.

According to the present embodiment, a substrate W is arranged on bottom electrode 18 within the plasma generating zone provided in vacuum chamber 11. To generate a plasma within the plasma generating zone, a discharge gas is introduced via gas introduction portion 12 into the plasma generating zone provided in vacuum chamber 11. This discharge gas is evenly diffused through plasma generating zone 41 by the plurality of gas diffusion holes 32 in top electrode 17.

The atmosphere within vacuum chamber 11 is exhausted via exhaust portion 13. In this way the interior of vacuum chamber may be maintained under a vacuum. High-frequency power from first high-frequency oscillator 19 is impressed on discharge electrode 14 via first matching circuit 20. This operation produces in plasma generating zone 41 a high-frequency electrical field extending laterally across plasma generating zone 41.

Magnetic lines of force 43 are produced by permanent magnets 15, 16. As noted, these magnetic lines of force 43 have portions that extend approximately parallel to the central axis of discharge electrode 14. Thus, a high-frequency electrical field and a magnetic field at approximately right angles to each other are produced within plasma generating zone 41. As a result, electrons are trapped by magnetic lines of force 43 in proximity to discharge electrode 14, and a magnetron action is produced. Electrons are accelerated by this magnetron action, causing the discharge gas to discharge. A plasma is generated in plasma generating zone 41 through this magnetron discharge. Hereinbelow this plasma shall be designated as the "first plasma."

(2) Plasma Generation Through High-frequency Oscillation Discharge

The operation of plasma generation through high-frequency oscillation discharge is now discussed.

According to the present embodiment, to generate a plasma, high-frequency power is impressed on top electrode 17 as well, provided by second high-frequency oscillator 20 via second matching circuit 22. This produces a high-frequency electrical field extending in the direction of the central axis 42 of discharge electrode 14 in plasma generating zone 41. As a result, high-energy electrons trapped by magnetic lines of force 43 are caused to oscillate at high frequency in the direction of this central axis 42. This high frequency oscillation heats the high-energy electrons. This heat causes the discharge gas to discharge. This high-frequency oscillation discharge creates a plasma in plasma generating zone 41. Hereinbelow this plasma shall be designated as the "second plasma."

(3) First Plasma Density

The discussion now turns to the density of the first plasma.

The density of the first plasma is dependent upon the efficiency with which magnetron discharge is generated. The efficiency of magnetron discharge is in turn dependent upon, for example, the strength of the high-frequency electrical field produced by discharge electrode 14 and by the strength and shape of the magnetic field produced by permanent magnets 15, 16. The electrical field and magnetic field are stronger at the perimeter of plasma generating zone 41 than in the central portion thereof. This is because the perimeter of plasma generating zone 41 is closer to discharge electrode 14 and permanent magnets 15, 16 than is the central portion. Thus, the efficiency of magnetron discharge is higher at the perimeter of plasma generating zone 41 than in the central portion thereof. As a result, first plasma density is higher at the perimeter of plasma generating zone 41 than in the central portion thereof.

However, the efficiency of magnetron discharge generation is not dependent solely upon high-frequency electrical field and magnetic field strength but also upon the number of high-energy electrons trapped by magnetic lines of force 43. High-energy electrons are abundant when magnetic lines of force 43 do not intersect electrodes 17, 18. This is because if magnetic lines of force 43 intersect electrodes 17, 18, the high-energy electrons trapped by magnetic lines of force 43 flow out via electrodes 17, 18.

According to the present embodiment, the magnetic lines of force 43 that pass through the central portion of plasma generating zone 41 are set up in such a way as to avoid intersecting electrodes 17, 18. By so doing outflow of high-energy electrons in the central portion of plasma generating zone 41 is inhibited. As a result, the efficiency of magnetron discharge is as high in the central portion as it is in the perimeter. In this way the efficiency with which the first plasma is generated can be increased in the central portion, as in the perimeter. As a result, a first plasma of high density is generated in the central portion, as in the perimeter.

(4) Second Plasma Density

The discussion now turns to the density of the second plasma.

The density of the second plasma is dependent upon the efficiency with which high-frequency oscillating discharge is generated. The efficiency of this discharge is in turn dependent upon the length of those portions of magnetic lines of force 43 that are approximately parallel to central axis 42 of discharge electrode 14. Specifically, the longer these parallel portions are, the higher the efficiency of high-frequency oscillating discharge, and the shorter they are, the lower. This is because greater length on the part of the parallel portions increases the distance over which high-energy electrons can undergo accelerated travel.

According to the present embodiment, the parallel portions are longer in the central portion than at the periphery of plasma generating zone 41. Thus, the efficiency of which high-frequency oscillating discharge is higher in the central portion than at the periphery thereof. As a result, second plasma density is higher in the central portion than at the periphery of plasma generating zone 41.

In this way, by generating a high-frequency oscillating discharge, it is possible to raise plasma density in the central portion of plasma generating zone 41 above the level which prevails in the absence of such a discharge. The enhanced density plasma is used for predetermined plasma processing of a substrate W.

(5) Control of Plasma Density

Control of plasma density is now discussed.

As noted, the density of the first plasma is dependent upon the strength of the high-frequency electrical field produced by discharge electrode 14. The strength of this high-frequency electrical field is in turn dependent upon the magnitude of the high-frequency power output by first high-frequency oscillator 19. The magnitude of the high-frequency power is controlled by control portion 26 on the basis of control input by a human operator. In this way, the density of the first plasma can be controlled through control of the magnitude of the high-frequency power on the basis of control input by a human operator.

The density of the second plasma is dependent upon the strength of the high-frequency electrical field produced by top electrode 17. The strength of this high-frequency electrical field is in turn dependent upon the magnitude of the high-frequency power output by second high-frequency oscillator 21. The magnitude of the high-frequency power is controlled by control portion 26 on the basis of control input by a human operator. In this way, the density of the second plasma can be controlled through control of the magnitude of the high-frequency power on the basis of control input by a human operator.

As noted, the first plasma is denser in the central portion of plasma generating zone 41 than at the periphery thereof. As noted, the second plasma, on the other hand, is denser at the periphery of plasma generating zone 41 than in the central portion thereof. Accordingly, through appropriate control of the magnitudes of the two high-frequency powers it is possible to generate a plasma of uniform density distribution throughout the entire plasma generating zone 41.

The ratio of the two high-frequency powers that gives uniform density distribution is substantially constant regardless of plasma density. In view of this fact, according to the present embodiment, when controlling the magnitudes of the two high-frequency powers, control is performed in such a way that the ratio of the two is equal to a predetermined value. By so doing, once the magnitude of one of the two high-frequency powers has been set by a human operator, the magnitude of the other can be corrected automatically. As a result, it is possible on a consistent basis to generate a plasma of uniform density distribution throughout the entire plasma generating zone 41.

(6) Differences from Plasma Generating Methods Using Ordinary Parallel Plate Electrodes The differences between plasma generation using electrodes 17, 18 and plasma generation using ordinary parallel plate electrodes are now discussed.

The electrodes 17, 18 employed in the present embodiment are substantially identical in morphology to ordinary parallel plate electrodes. However, the method by which a plasma (second plasma) is generated by these electrodes 17, 18 is different from the method by which a plasma is generated by ordinary parallel plate electrodes.

Specifically, where a plasma is generated by ordinary parallel plate electrodes, the plasma is principally the result of secondary electrons resulting from bombardment of plate electrode surfaces by ions previously accelerated by the plate electrode sheath voltage; heating of electrons by high-frequency fluctuations of the sheath voltage; and heating of electrons by the ohmic resistance of the plasma.

In contrast, where a plasma is, generated with electrodes 17, 18, the plasma is generated through heating of electrons by high-frequency oscillation of high-energy electrons trapped by the magnetic lines of force 43.

With methods for generating plasmas with ordinary parallel plate electrodes, plasmas of moderately high density can be generated provided that discharge gas pressure is high. Where gas pressure is low, however, a high-density plasma cannot be generated. Here, high gas pressure refers to gas pressures of 13.3 Pa (0.1 Torr) or higher, for example. Low gas pressure, on the other hand, refers to gas pressures of 3990 mPa (30 mTorr) or lower, for example.

According to the present embodiment, however, the magnetic lines of force 43 are generated in so as to avoid intersecting electrodes 17, 18. Thus, high-energy electrons may be efficiently trapped by the magnetic lines of force 43. As a result, a high-density plasma can be generated even at gas pressures as low as 133 mPa (1 mTorr). In other words, the gas introduced into the plasma generating zone is efficiently discharged through interaction of a high-frequency electrical field and a magnetic field, thus generating a high-density plasma.

[1-3] Working Effect of the Embodiment

The embodiment described hereinabove affords the following working effects.

(1) According to the present embodiment, notwithstanding the rectangular configuration of the fistulous discharge electrode, magnetic field strength is high at the corners of the electrode to which the magnetic field is applied, so that the electrical field does not become concentrated at the corners of the electrode. Accordingly, higher density of the generated plasma at the corners of the electrode is avoided, as is a higher rate of film deposition in proximity to the corners of the electrode. Additionally, if the high-frequency power input is increased in order to raise the throughput of the apparatus, high sheath voltage is nevertheless prevented from forming on the cathode electrode surface to which the high frequency is applied, thus avoiding the problem of metal contamination from the electrode surface.

(2) According to the present embodiment, the vacuum chamber in which the substrate is processed is of rectangular configuration like that of the substrate, and thus in contradistinction to the conventional magnetron source employing annular high-frequency electrodes (JP(A) 7-201831), processing of a large-area rectangular substrate does not require excessive volume on the part of the vacuum chamber, so that the efficiency of utilization of the gas and the efficiency of utilization of the electrodes are good.

(3) According to the present embodiment, the magnetic lines of force 43 passing through the center of plasma generating zone 41 are generated so as to avoid intersecting electrodes 17, 18. This affords higher efficiency of magnetron discharge generation in the central portion of plasma generating zone 41 as well as in the peripheral area thereof. As a result, a high-density plasma may be generated in the central portion as well as in the peripheral area. For a given magnitude of high-frequency power applied to discharge electrode 14, the present embodiment affords first plasma density that is greater by a factor of 10 than that with the apparatus disclosed in JP(A) 7-201831.

(4) Further, according to the present embodiment, the pair of electrodes 17, 18 are fabricated from a conducting material. Thus, the density of the second plasma can be electrically controlled using electrodes 17.

(5) Further, according to the present embodiment, high-frequency power is applied to top electrode 17. This produces a high-frequency oscillating discharge. The result is higher plasma density in the central portion of plasma generating zone 41 than would be the case in the absence of the discharge.

(6) Still further, according to the present embodiment, bottom electrode 18 is grounded. This allows a lower sheath voltage to form on the surface of bottom electrode 18. As a result, metal contamination of bottom electrode 18 due to sheath voltage can be reduced. A plasma surface treatment apparatus constructed using this apparatus will also produce a lower sheath voltage on the surface of a substrate W resting on bottom electrode 18. As a result, damage to substrate W by the sheath voltage can be reduced.

(7) Further, according to the present embodiment, the high-frequency power applied to discharge electrode 14 and the high-frequency power applied to top electrode 17 are output by separate high-frequency oscillators 19. 21. Thus, the levels of the two high-frequency power outputs can be set independently. As a result, the density of the first plasma and the density of the second plasma can be set independently. This affords a uniform plasma density distribution in the radial direction of discharge electrode 14.

(8) Still further, according to the present embodiment, there is provided a control portion 26 for controlling the magnitudes of the high-frequency power outputs of high-frequency oscillators 19, 21. This affords control of the density of the first plasma and the density of the second plasma. As a result, the plasma density distribution in the radial direction of discharge electrode 14 can be controlled.

(9) Further, according to the present embodiment, the magnitudes of the two high-frequency power outputs are controlled such that the ratio of the two is constantly held at a predetermined value. Accordingly, the plasma density distribution in the radial direction of discharge electrode 14 is constantly maintained at the desired density distribution. This reduces the burden on a human operator in controlling the magnitudes of the high-frequency power outputs.

(10) Still further, according to the present embodiment, top electrode 17 is provided as a separate wall rather than using the top panel 111 of vacuum chamber 11. This allows top electrode 17 to be used as a gas diffusion plate for diffusing the discharge gas. Further, in a plasma surface treatment apparatus constructed using the plasma generating apparatus according to the present embodiment, it is possible to employ bottom electrode 18 as the susceptor for holding substrate W.

[2] Embodiment 2

Figure 5:
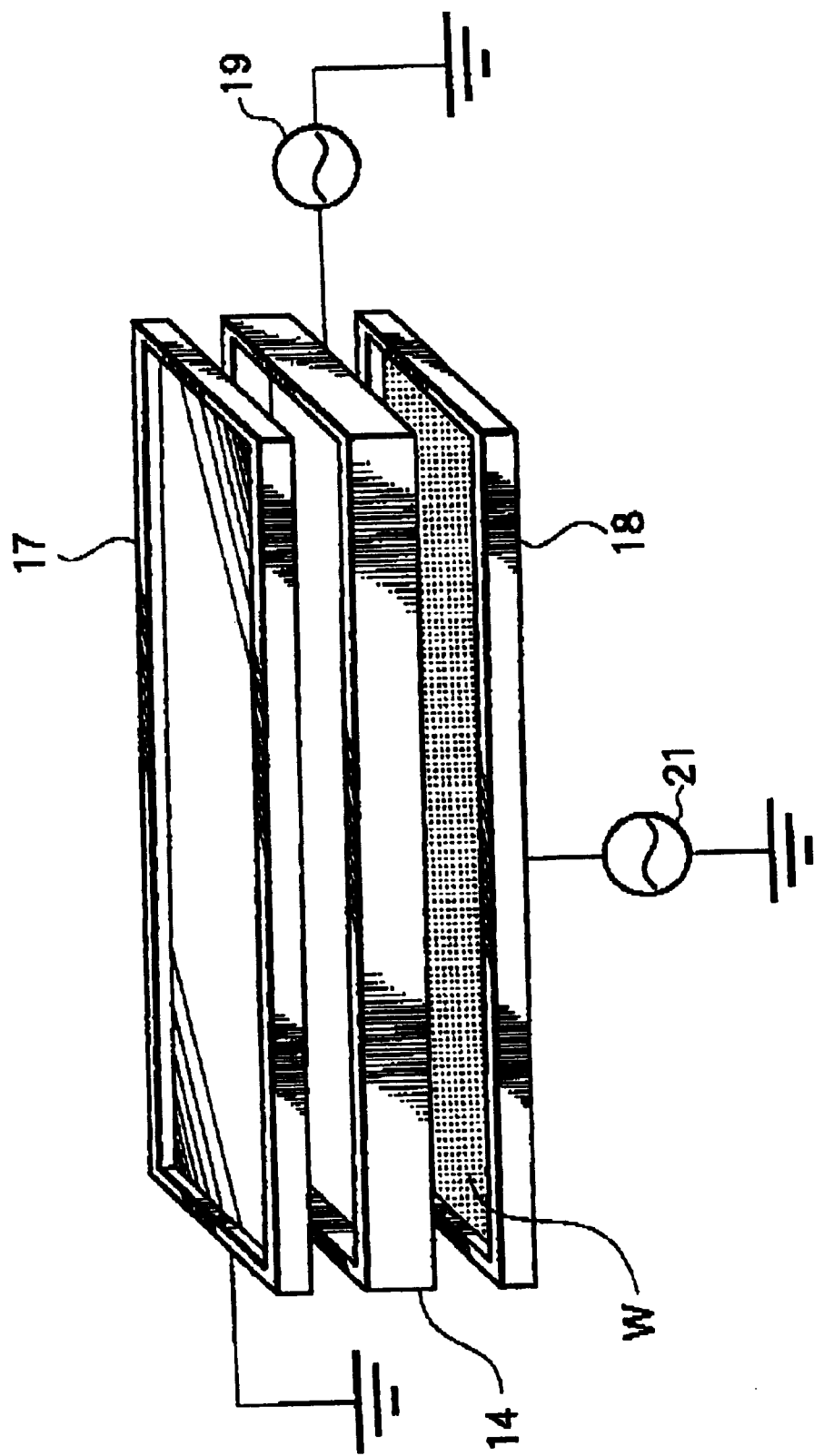
FIG. 5 is a simplified structural diagram of a second embodiment.

FIG. 5 is a simplified illustration of a design according to a second embodiment of the invention. While fundamentally identical to the apparatus shown in FIG. 1, to this simplified illustration dispenses with the details in order to emphasize the differences therefrom. This treatment shall be adopted the third and subsequent embodiments, described later, as well.

In the preceding first embodiment, high-frequency power is applied to top electrode 17. In the present embodiment, however, high-frequency power from the second high-frequency oscillator 21 is applied to bottom electrode 18, with top electrode 17 being grounded. This design affords substantially the same working effect as the preceding embodiment, but provides the following additional advantages.

According to the present embodiment, top electrode 17 is grounded, whereby the sheath voltage on the surface of top electrode 17 can be held to a low level. As a result, damage to top electrode 17 by sheath voltage can be reduced. Further, in a plasma surface treatment apparatus constructed using the present apparatus, sheath voltage-induced metal contamination of top electrode 17 can be reduced.

[3] Embodiment 3

Figure 6:
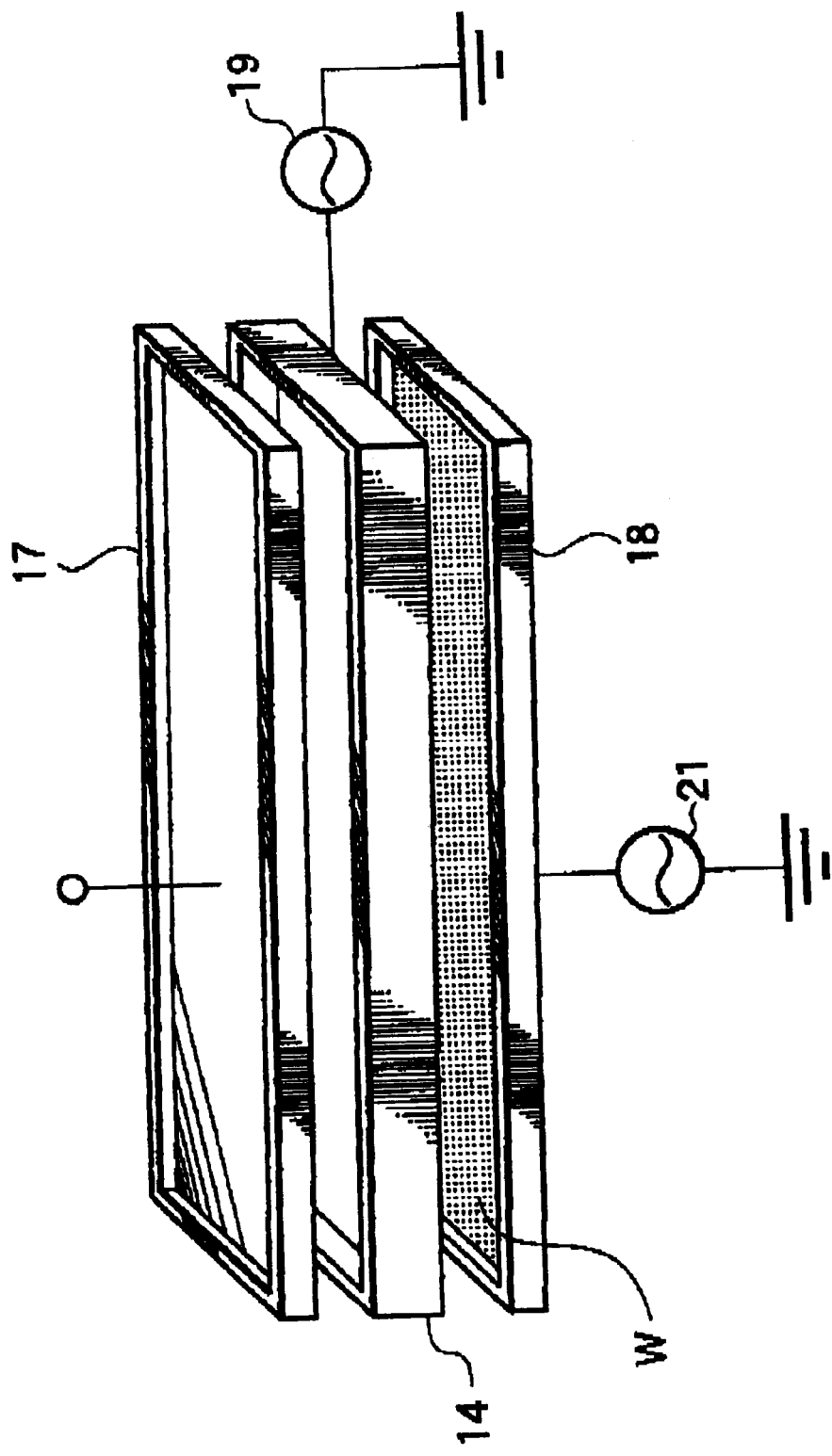
FIG. 6 is a simplified structural diagram of a third embodiment.

FIG. 6 is a simplified illustration of a design according to a third embodiment of the invention. In the preceding second embodiment, top electrode 17 is grounded. In the present embodiment, however, top electrode 17 is electrically floating. This design affords even lower sheath voltage on the surface of top electrode 17 than does the Embodiment 2. Further reductions in damage to top electrode 17 by sheath voltage and in sheath voltage-induced metal contamination of top electrode 17 are afforded thereby.

[4] Embodiment 4

Figure 7:
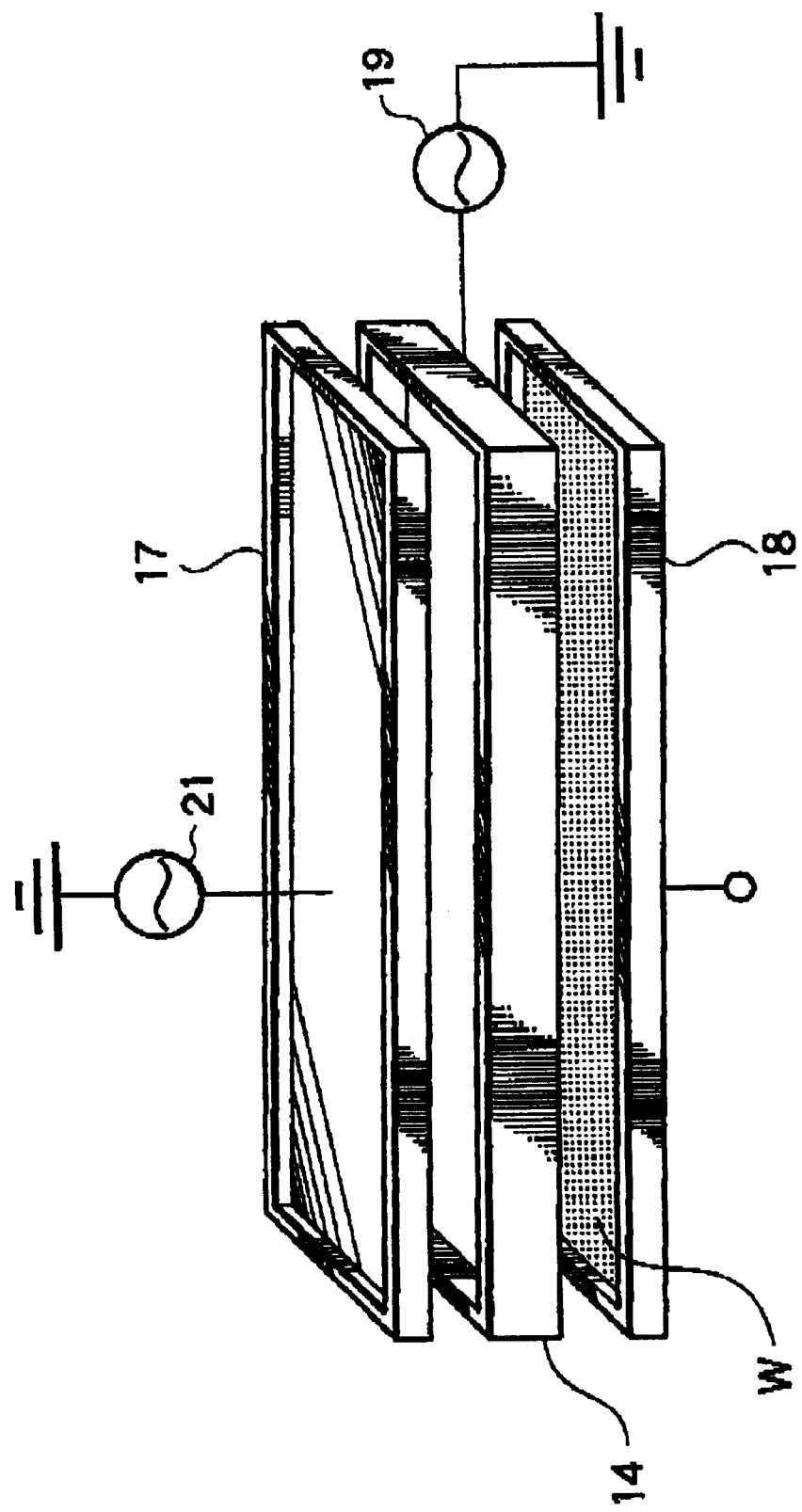
FIG. 7 is a simplified structural diagram of a fourth embodiment.

FIG. 7 is a simplified illustration of a design according to a fourth embodiment of the invention. In the preceding first embodiment, bottom electrode 18 is grounded. In the present embodiment, however, bottom electrode 18 is electrically floating. This design affords even lower sheath voltage on the surface of a substrate W resting on bottom electrode 16 than does the Embodiment 1. Further reduction in damage to substrate W by sheath voltage is afforded thereby.

[5] Embodiment 5

Figure 8:
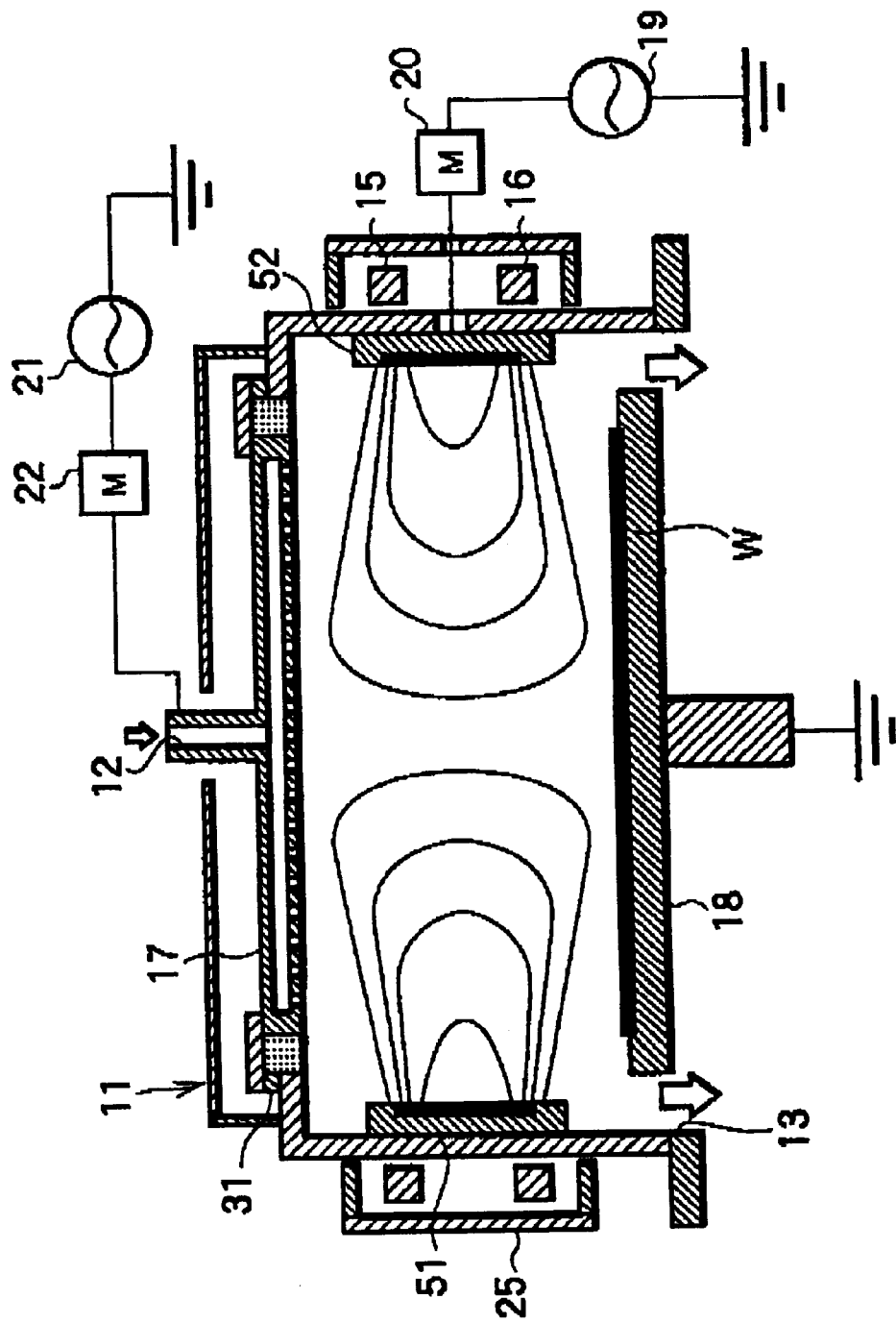
FIG. 8 is a side sectional view of a fifth embodiment.

FIG. 8 is a side sectional view of a design according to a fifth embodiment of the invention. In the apparatus depicted in FIG. 8, elements having the same function as in the apparatus of FIG. 1 are assigned the same symbols as in the latter, dispensing with detailed descriptions thereof. Control portion 26 has been omitted from the figure.

In the preceding Embodiments 1 to 4, the rectangular fistulous discharge electrode 14 constitutes a portion of the wall of vacuum chamber 11, with dielectrics 29, 30 being interposed in the joint between vacuum chamber 11 and the discharge electrode. In other words, vacuum chamber 11 and discharge electrode 14 are of unitary construction. In the present embodiment, however, vacuum chamber 11 and discharge electrode 151 are discrete elements, as shown in FIG. 8.

Referring to FIG. 8, a rectangular fistulous discharge electrode 51 is arranged within vacuum chamber 11. The gap between rectangular fistulous discharge electrode 51 and vacuum chamber is equal to less than half of the mean free path of electrons in the plasma under the gas pressure employed in the process. This design obviates the need to partition the vacuum chamber 11, providing a more simple construction for the vacuum chamber 11. A gap between rectangular fistulous discharge electrode 51 and vacuum chamber is equal to less than half of the mean free path of electrons in the plasma also prevents discharge within the gap.

Here, a dielectric (e.g., high purity aluminum nitride, quartz glass, ceramic, etc.) 52 can be interposed in the gap between the rectangular fistulous discharge electrode 51 and the vacuum chamber 11, as shown in FIG. 8. The length of the dielectric 52 in the axial direction thereof is greater than the length of the rectangular fistulous discharge electrode 51 in the axial direction thereof. The discharge electrode 51 can be embedded in dielectric 52 to produce a flat configuration in which the top face of discharge electrode 51 is coplanar with the surface of dielectric 52. This prevents discharge from becoming concentrated at the edges of the rectangular fistulous discharge electrode 51.

[6] Embodiment 6

In the preceding Embodiments 1 to 5, nothing is arranged on the top parallel plate electrode 17 other than the top panel 11. In the plasma generating apparatus according to the present embodiment, however, at least two rectangular permanent magnets 71, 81 are symmetrically nested on top parallel plate electrode 17, as shown in FIGS. 9 and 10.

Figure 9:
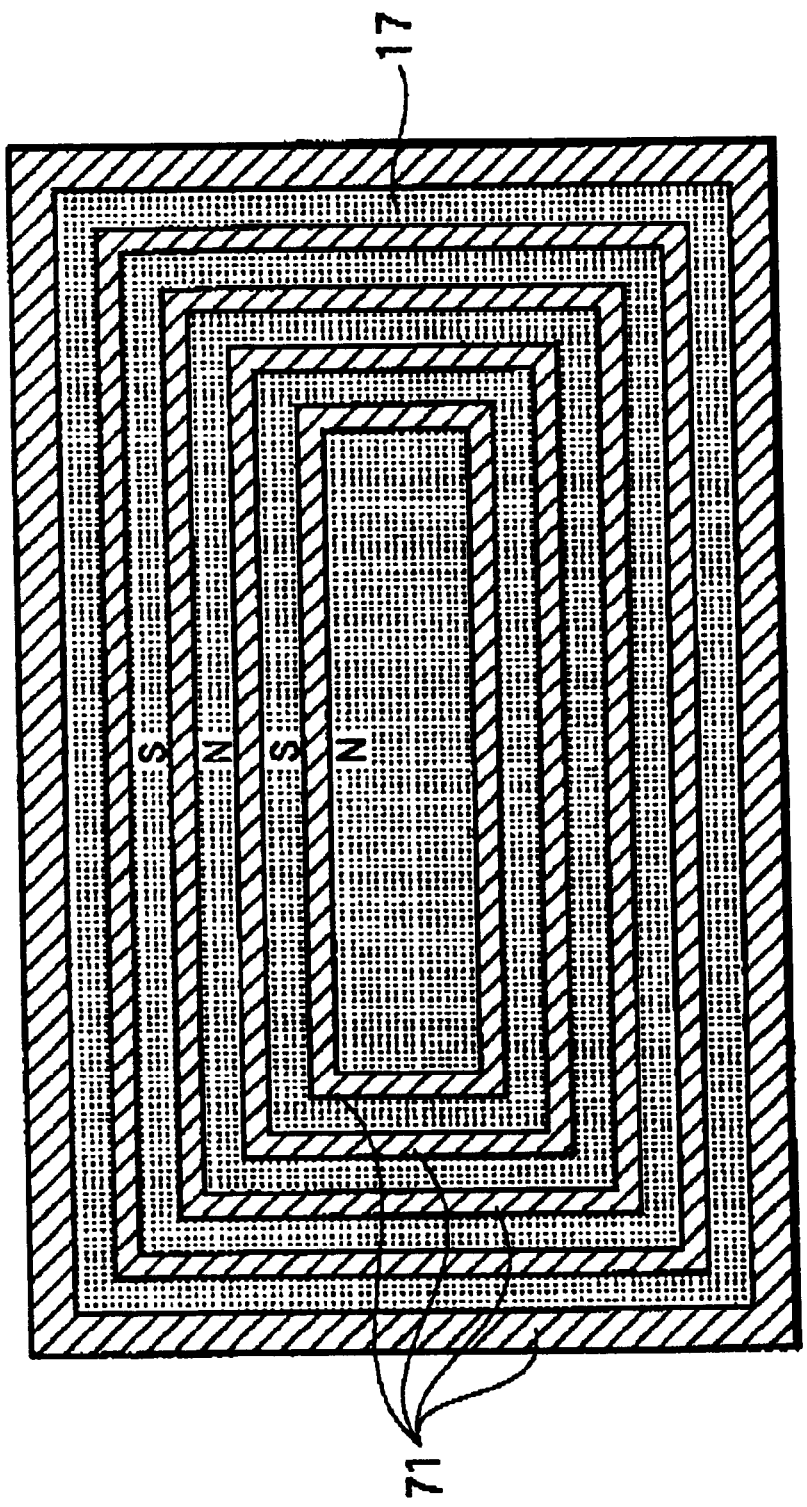
FIG. 9 is a plan view showing an alternative top electrode in the sixth embodiment.
Figure 10:
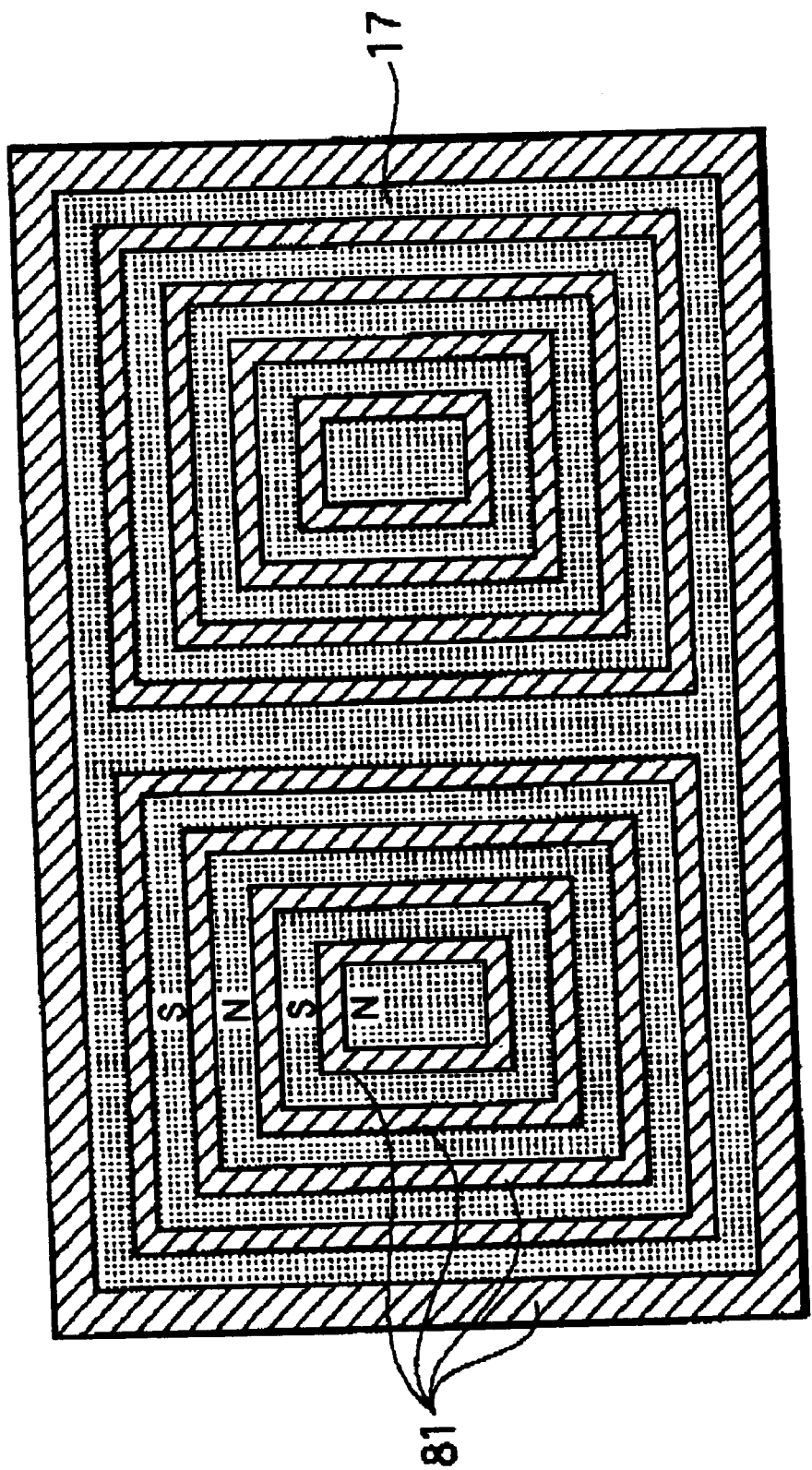
FIG. 10 is a plan view showing yet another alternative top electrode in the sixth embodiment.

In the arrangement depicted in FIG. 9, four rectangular band-shaped permanent magnets 71 are symmetrically nested. The permanent magnets 71 are magnetized in the radial direction. As with the pair of permanent magnets 15,16 described previously, these permanent magnets 71 are magnetized in mutually opposite directions. Here, for the innermost permanent magnet 71, the inside portion is the N pole and the outside portion is the S pole; for the second innermost permanent magnet 71, the inside portion is the S pole and the outside portion is the N pole; for the third innermost permanent magnet 71, the inside portion is the N pole and the outside portion is the S pole; and for the outermost permanent magnet 71, the inside portion is the S pole and the outside portion is the N pole. In the arrangement depicted in FIG. 10, four rectangular band-shaped permanent magnets 81 are symmetrically nested, as in the arrangement depicted in FIG. 9, but with the difference that the fourfold arrangement form laterally symmetrical sets.

In this way, within plasma generating zone 41 are produced looping magnetic lines of force that extend from the inside portions of permanent magnets 71, 81 (hereinafter referred to collectively as permanent magnets 71) towards the central axis 42 of discharge electrode 14, and then extend back towards permanent magnet 71. The interaction of the magnetic lines of force emitted by each portion of permanent magnet 71 as a general rule causes the magnetic lines of force to deflect back before reaching the substrate, so that magnetic field strength is greatly attenuated at the substrate surface.

Placement of permanent magnets 71 on top electrode 17 generates a magnetron discharge through the interaction of the applied high-frequency electrical field with the magnetic field of permanent magnets 71 produced on the plasma generating zone 41 side of top electrode 17, affording efficient plasma generation even at low pressure and an efficient process.

Where the magnetic field at the substrate surface is too strong to be ignored (20 gauss or above), an uneven plasma distribution will result at the substrate surface, making uniform processing impossible. The magnetic field also causes charges to build up on the substrate surface, which may damage the substrate W. It is therefore necessary to prevent a magnetic field from forming on the substrate surface. To prevent a magnetic field from forming on the substrate surface, permanent magnets 71 are arranged on top electrode 17 only, and are not provided to bottom electrode 18. In preferred practice, the number of permanent magnets 71 arranged on top electrode 17 will be an even number, in order to weaken magnetic field strength at the substrate surface. An odd number will produce a divergent magnetic field, as a result of which magnetic field strength will not be attenuated at the substrate surface.

[7] Additional Embodiments Plasma generating apparatuses are designed for plasma processing over a wide pressure range of from 0.1 to 40 Pa. The plasma generating method of the present embodiment affords outstanding control of the plasma making it adaptable to a wide range of pressures. The wide pressure range in turn makes possible a Large number of processes.

In preferred practice, the distance to substrate W from the gas shower plate 37 delivering the gas will be at least 5 cm. A distance of 5 cm or greater from the gas shower plate 37 to the substrate allows the gas jetted from the gas diffusion holes of the gas shower plate 37 to become substantially uniformly diffused in the space between the gas shower plate 37 and substrate W before reaching the substrate surface, affording a uniform process.

According to Embodiment 1, magnetic lines of force 43 are produced so as to avoid intersecting the pair of electrodes 17, 18 over the entire plasma generating zone 41. It is alternatively possible to generate magnetic lines of force 43 exclusively in the peripheral area of the plasma generating zone 41, with the central portion being devoid thereof. In other words, magnetic lines of force can be produced so as to intersect the pair of electrodes in the central portion.

With this design, high-density plasma can nevertheless be generated in the central portion of the plasma generating zone. This is possible because high-energy electrons trapped by magnetic lines of force 43 caused to oscillate at high-frequency. That is, according to the present embodiment, all magnetic lines of force 43 intersect the pair of electrodes 17, 18 in the central portion of plasma generating zone 41. Thus, the number of high-energy electrons trapped by magnetic lines of force 43 in this area declines. As a result, the efficiency of plasma generation in this area drops.

According to the present embodiment, however, high-frequency power is applied to bottom electrode 18. High-energy electrons trapped by magnetic lines of force 43 are thereby caused to oscillate at a high frequency. Second plasma is generated as a result. The efficiency of generation of this second plasma is higher in the central portion than in the peripheral area of plasma generating zone 41. Thus, this second plasma compensates for the drop the efficiency of generation of the first plasma in the central portion of plasma generating zone 41. As a result, high-density plasma can be generated in the central portion of plasma generating zone 41 as well.

According to the present invention, a modified high-frequency discharge produced by a rectangular fistulous discharge electrode affords efficient plasma generation at low pressures, even in a vacuum chamber having a rectangular interior, thus affording plasma processing of rectangular substrates, such as liquid crystal display substrates and substrates for solar cell fabrication.

The plasma generating apparatus of the present invention allows the energy of plasma generation and the charged particles incident on a substrate to be controlled independently, making possible high-quality plasma surface treatment. The production of magnetic lines of force having components that are parallel to the surface of the rectangular fistulous discharge electrode reduces formation of sheath voltage on the electrode surface, reducing metal contamination from the electrode surface. The present invention gives significant advantages when implemented in a plasma dry etching is apparatus or plasma CVD apparatus for rectangular substrates requiring rapid, high-quality plasma processing.

What is claimed is:

1. A plasma generating apparatus, comprising:
  a vacuum chamber of rectangular cross section perpendicular to a central axis thereof, having a plasma generating zone provided therein;
  a gas introducer for introducing a discharge gas into this vacuum chamber;
  an exhaust for exhausting the atmosphere within said vacuum chamber;
  a discharge electrode configured to be in a tube shape of a rectangular cross section perpendicular to a central axis thereof, arranged surrounding said plasma generating zone, for inducing discharge of the gas introduced into said plasma generating zone by said gas introducer;

a first high-frequency power supplier for supplying high-frequency power to said discharge electrode for inducing discharge of said gas;

magnetic lines of force generator for producing magnetic lines of force within said plasma generating zone; and a pair of rectangular parallel plate electrodes, arranged so as to sandwich said plasma generating zone in the direction of the central axis of said discharge electrode and to define a range of said plasma generating zone in the direction of this central axis.

2. The plasma generating apparatus according to claim 1, wherein said magnetic lines of force generator produces magnetic lines of force comprising portions that extend approximately parallel to the central axis of said fistulous discharge electrode of rectangular shape, these parallel portions increasing in length closer to said central axis.

3. The plasma generating apparatus according to claim 2, wherein said magnetic lines of force generator comprises permanent magnets arranged coaxially with said fistulous discharge electrode of rectangular shape so as to surround said discharge electrode, said two permanent magnets being arranged along the central axis, and having polarities radially magnetized in opposite directions to each other.

4. The plasma generating apparatus according to claim 3, wherein the magnetic lines of force on surface of the fistulous discharge electrode of rectangular shape are such that the flux density of the component coextensive with the central axis of the discharge electrode is lower proceeding from the center of said discharge electrode surface towards the ends of the central axis, and the directional component orthogonal to said central axis is higher proceeding from the center of said discharge electrode surface towards the ends of the central axis.

5. The plasma generating apparatus according to claim 2, wherein said fistulous discharge electrode of rectangular shape is situated within the vacuum chamber, with the gap between the fistulous discharge electrode of rectangular shape and the inside wall of said vacuum chamber being less than half of the mean free path of electrons in the plasma under the gas pressure that will be employed in the process.

6. The plasma generating apparatus according to claim 5, wherein said fistulous discharge electrode of rectangular shape is situated within the vacuum chamber, with a dielectric material being interposed in the gap between the fistulous discharge electrode of rectangular shape and the inside wall of the vacuum chamber.

7. The plasma generating apparatus according to claim 6, wherein at least two rectangular permanent magnets are symmetrically nested on one of said pair of rectangular parallel plate electrodes.

8. The plasma generating apparatus according to claim 2, wherein said fistulous discharge electrode of rectangular shape is provided with curvature at the corners thereof.

9. The plasma generating apparatus according to claim 1, wherein said magnetic lines of force generator comprises permanent magnets arranged coaxially with said fistulous discharge electrode of rectangular shape so as to surround said discharge electrode, said two permanent magnets being arranged along the central axis, and having polarities radially magnetized in opposite directions to each other.

10. The plasma generating apparatus according to claim 9, wherein the magnetic lines of force on surface of the fistulous discharge electrode of rectangular shape are such that the flux density of the component coextensive with the central axis of the discharge electrode is lower proceeding from the center of said discharge electrode surface towards the ends of the central axis, and the directional component orthogonal to said central axis is higher proceeding from the center of said discharge electrode surface towards the ends of the central axis.

11. The plasma generating apparatus according to claim 1, wherein said fistulous discharge electrode of rectangular shape is situated within the vacuum chamber, with the gap between the fistulous discharge electrode of rectangular shape and the inside wall of said vacuum chamber being less than half of the mean free path of electrons in the plasma under the gas pressure that will be employed in the process.

12. The plasma generating apparatus according to claim 11, wherein said fistulous discharge electrode of rectangular shape is situated within the vacuum chamber, with a dielectric material being interposed in the gap between the fistulous discharge electrode of rectangular shape and the inside wall of the vacuum chamber.

13. The plasma generating apparatus according to claim 12, wherein at least two rectangular permanent magnets are symmetrically nested on one of said pair of rectangular parallel plate electrodes.

14. The plasma generating apparatus according to claim 1, wherein said fistulous discharge electrode of rectangular shape is provided with curvature at the corners thereof.

15. A substrate plasma processing method, comprising the steps of:

providing a vacuum chamber of rectangular cross section having a plasma generating zone defined therein; a fistulous discharge electrode of rectangular shape arranged surrounding said plasma generating zone: and a pair of rectangular parallel plate electrodes, arranged so as to sandwich said plasma generating zone in the direction of the central axis of said discharge electrode to define said plasma generating zone in the direction of this central axis;

arranging a substrate within said plasma generating zone;

producing a high-frequency electrical field in said plasma generating zone by supplying high-frequency power to said discharge electrode and said parallel plate electrodes;

producing a magnetic field in said plasma generating zone;

introducing a discharge gas into said plasma generating zone provided within said vacuum chamber while exhausting the atmosphere within said vacuum chambers;

producing plasma by inducing discharge of the gas introduced into said plasma generating zone by means of interaction between said high-frequency electrical field and said magnetic field; and subjecting said substrate to a predetermined plasma process using the plasma so generated.

* * * * *

UNITED STATES PATENT AND TRADEMARK OFFICE
CERTIFICATE OF CORRECTION

PATENT NO.   : 6,380,684 B1
DATED        : April 30, 2002
INVENTOR(S)  : Yunlong Li et al.

It is certified that error appears in the above-identified patent and that said Letters Patent is hereby corrected as shown below:

Title page,
Item [73], Assignee, should read as follows:
-- [73] Assignee: Hitachi Kokusai Electric Inc., Tokyo
             Noriyoshi Sato, Sendai --

Column 20,
Lines 31-58, should read as follows:

--    15.    A substrate plasma processing method, comprising the
      steps of:
          providing a vacuum chamber of rectangular cross section
              having a plasma generating zone define therein; a
              fistulous discharge electrode of rectangular shape
              arranged surrounding said plasma generating zone; and
              a pair of rectangular parallel plate electrodes, arranged
              so as to sandwich said plasma generating zone in the
              direction of the central axis of said discharge electrode
              to define said plasma generating zone in the direction of
              this central axis;
          arranging a substrate within said plasma generating zone;
          producing a high-frequency electrical field in said plasma
              generating zone by supplying high-frequency power to
              said discharge electrode and said parallel plate electrodes;
          producing a magnetic field in said plasma generating
              zone;
          introducing a discharge gas into said plasma generating
              zone provided within said vacuum chamber while
              exhausting the atmosphere within said vacuum chamber;

UNITED STATES PATENT AND TRADEMARK OFFICE
CERTIFICATE OF CORRECTION

PATENT NO. : 6,380,684 B1
DATED : April 30, 2002
INVENTOR(S) : Yunlong Li et al.

It is certified that error appears in the above-identified patent and that said Letters Patent is hereby corrected as shown below:

Column 20 cont'd,
    producing plasma by inducing discharge of the gas introduced into said plasma generating zone by means of interaction between said high-frequency electrical field and said magnetic field; and
    subjecting said substrate to a predetermined plasma process using the plasma so generated. --

Signed and Sealed this

First Day of October, 2002

Attest:

Attesting Officer

JAMES E. ROGAN
Director of the United States Patent and Trademark Office